(12) United States Patent
Cesar

(10) Patent No.: US 12,249,986 B2
(45) Date of Patent: *Mar. 11, 2025

(54) LEVEL CONVERTER CIRCUIT

(71) Applicant: STMicroelectronics (Grenoble 2) SAS, Grenoble (FR)

(72) Inventor: Etienne Cesar, Voreppe (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/364,950

(22) Filed: Aug. 3, 2023

(65) Prior Publication Data

US 2023/0378957 A1 Nov. 23, 2023

Related U.S. Application Data

(63) Continuation of application No. 17/382,794, filed on Jul. 22, 2021, now Pat. No. 11,757,448.

(30) Foreign Application Priority Data

Aug. 4, 2020 (FR) ...................... 2008274

(51) Int. Cl.
*H03K 19/0185* (2006.01)
*H03K 3/011* (2006.01)
*H03K 19/003* (2006.01)

(52) U.S. Cl.
CPC ..... *H03K 19/018521* (2013.01); *H03K 3/011* (2013.01); *H03K 19/00369* (2013.01); *H03K 19/00384* (2013.01)

(58) Field of Classification Search
CPC ............ H03K 3/011; H03K 19/00369; H03K 19/00384; H03K 19/018507; H03K 19/018521

See application file for complete search history.

(56) References Cited

U.S. PATENT DOCUMENTS

| 4,956,567 A | 9/1990 | Hunley et al. |
| 11,757,448 B2* | 9/2023 | Cesar ............... H03K 19/00369 |
| | | 327/333 |
| 2006/0208759 A1* | 9/2006 | Nojiri .................... H03K 3/013 |
| | | 326/81 |
| 2016/0118977 A1 | 4/2016 | Yi et al. |

FOREIGN PATENT DOCUMENTS

| CN | 106788284 A | 5/2017 |
| WO | 2007048447 A1 | 5/2007 |

OTHER PUBLICATIONS

Garcia, Jose C., et al., "High Performance Bootstrapped CMOS Dual Supply Level Shifter for 0.5V Input and 1V Output", IEEE 12th Euromicro Conference on Digital System Design / Architecture, Methods and Tools, Greece, Aug. 27-29, 2009, 4 pages.
Petrica, Radu-Valentin, et al., "Comparison of Level Shifter Architecture: Application to I/O Cell", IEEE International Semiconductor Conference (CAS), Romania, Oct. 10-12, 2018, 4 pages.
Tsiatouhas, Yiorgos "A Stress-Relaxed Negative Voltage-Level Converter", IEEE Transactions on Circuits and Systems—II: Express Briefs, vol. 54, No. 3, Mar. 2007, 5 pages.

* cited by examiner

*Primary Examiner* — Patrick O Neill
(74) *Attorney, Agent, or Firm* — Slater Matsil, LLP

(57) ABSTRACT

An embodiment level converter circuit is configured to receive, as a current supply, a current proportional to temperature.

20 Claims, 2 Drawing Sheets

LEVEL CONVERTER CIRCUIT

CROSS-REFERENCE TO RELATED APPLICATIONS

This application is a continuation of U.S. patent application Ser. No. 17/382,794, filed on Jul. 22, 2021, now U.S. Pat. No. 11,757,448 issued on Sep. 12, 2023, which claims the benefit of French Patent Application No. 2008274, filed on Aug. 4, 2020, which applications are hereby incorporated herein by reference.

TECHNICAL FIELD

The present disclosure generally relates to electronic devices and circuits. The present disclosure more specifically applies to the forming of a circuit for converting levels of an analog signal.

BACKGROUND

An analog signal may be enabled to transmit binary information. For this purpose, the data are represented by the voltage level of the signal. The signal represents a logic "1" if the voltage is greater than a first voltage level: the high threshold, and represents a logic "0" if the voltage is smaller than a second voltage level: the low threshold.

A level converter circuit is a circuit used to offset the voltage levels, and thus the high and low thresholds, used by an analog signal to represent binary data.

It would be desirable to at least partly improve certain aspects of known level converter circuits.

SUMMARY

There is a need for higher-performance level converter circuits.

An embodiment overcomes all or part of the disadvantages of known converter circuits.

An embodiment provides a level converter circuit capable of receiving, as a current, a current proportional to temperature.

According to an embodiment, the circuit comprises a first inverter circuit comprising a first transistor of a first type and a second transistor of a second type.

According to an embodiment, the first and second transistors are MOS transistors.

According to an embodiment, the first transistor is an N-type MOS transistor and the second transistor is a P-type MOS transistor.

According to an embodiment, the second transistor is capable of receiving the current proportional to temperature on its gate.

According to an embodiment, the first transistor is capable of receiving an input signal on its gate.

According to an embodiment, the input signal has a variable high voltage level.

According to an embodiment, the input signal has a high voltage level randomly variable between two voltage levels.

According to an embodiment, the first and second transistors form part of a conversion circuit comprised within the level converter circuit.

According to an embodiment, the circuit comprises a current supply circuit capable of supplying the current proportional to temperature.

According to an embodiment, the conversion circuit and the supply circuit are formed on a same substrate.

According to an embodiment, the current supply circuit comprises a first current mirror circuit.

According to an embodiment, the first current mirror circuit comprises N-type MOS transistors.

According to an embodiment, the current supply circuit comprises a second current mirror circuit.

According to an embodiment, the second current mirror circuit comprises P-type MOS transistors.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
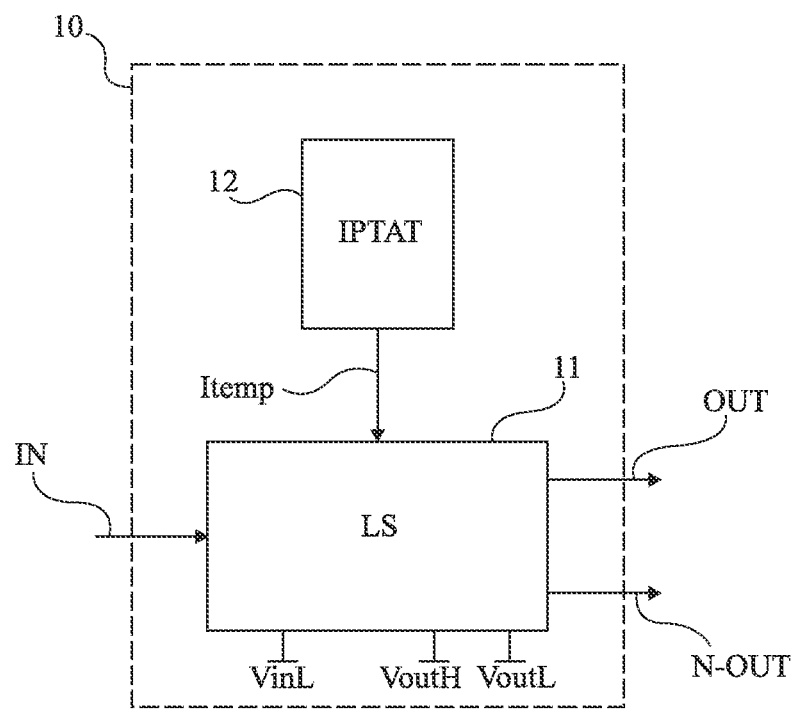
FIG. 1 very schematically shows in the form of blocks an embodiment of a level converter circuit.

FIG. 1 schematically shows in the form of blocks an embodiment of a level converter circuit 10.

Converter circuit 10 receives, as an input, an analog input signal IN and outputs an analog output signal OUT. Input and output signals IN and OUT are used to transfer binary data. Converter circuit 10 is capable of converting the voltage levels of input signal IN into different voltage levels, output signal OUT corresponding to the converted input signal IN. The succession of logic states of output signal OUT is thus the same as that of input signal IN. More particularly, input signal IN is an analog signal comprising two states, a low state representing a logic "0" having a voltage level smaller than a first voltage level VinL, and a high state representing a logic "1" having a voltage level greater than a second voltage level VinH. Second voltage level VinH is greater than first voltage level VinL. Output signal OUT is an analog signal comprising two states, a low state representing a logic "0" having a voltage level smaller than a first voltage level VoutL, and a high state representing a logic "1" having a voltage level greater than a second voltage level VoutH. Second voltage level VoutH is greater than first voltage level VoutL.

Optionally, converter circuit 10 may output a second output signal N-OUT. Output signal N-OUT is an analog signal comprising two logic states, a low state representing a logic "0" having a voltage level smaller than voltage level VoutL, and a high state representing a logic "1" having a voltage level greater than voltage level VoutH. Output signal N-OUT represents a succession of logic states corresponding to the inverse of the logic states represented by output signal OUT.

Converter circuit 10 comprises a conversion circuit 11 (LS) receiving input signal IN and outputting output signal OUT and, optionally, output signal N-OUT. The conversion circuit receives, as a current, a current Itemp and receives, as voltages, voltage levels VinL, VoutH, and VoutL. Converter circuit 10 does not receive voltage level VinH. A detailed example of conversion circuit 11 is described in relation with FIG. 2.

Converter circuit 10 further comprises a power supply circuit 12 (IPTAT) capable of supplying current Itemp. Current Itemp is a current proportional to the room temperature. An example of power supply circuit 12 is detailed in relation with FIG. 2.

According to an embodiment, conversion circuit 11 and power supply circuit 12 are both formed on a same substrate, for example, a same silicon substrate.

Converter circuit 10 operates as follows. When input voltage IN is greater than a threshold VIH, output voltage OUT is set to voltage level VoutH and output voltage N-OUT is set to voltage level VoutL. When input voltage IN is smaller than or equal to a threshold VIL, output voltage OUT is set to voltage level VoutL, and output voltage N-OUT is set to voltage level VoutH. Voltage levels VinL and VoutL are smaller than threshold VIL. Voltage levels VinH and VoutH are greater than threshold VIH.

The inventors have observed that by supplying conversion circuit 11 with a current proportional to temperature, the number of conversion errors, that is, the number of erroneously converted bits, decreases. A conversion error may for example correspond to a non-compliance with a threshold VIH or VIL. Indeed, controlling an input transistor of conversion circuit 11 with current Itemp proportional to temperature enables to compensate for the drift of the switching threshold of the transistor. This phenomenon will be detailed in relation with FIGS. 3 and 4.

In certain cases, the thresholds are defined by a standard, and an advantage of converter circuit 10 is that, due to the supply of its conversion circuit with the current proportional to temperature, it may comply with the standard.

Another advantage of converter circuit 10 is that it enables to convert input signal IN without knowing the "high" voltage level VinH. Thus, converter circuit 10 may convert an input signal IN having its "high" voltage level VinH varying, for example, randomly, between a plurality of voltage levels. According to an embodiment, the voltage level VinL of input signal IN is in the order of 0 V, the voltage level VinH of input signal IN varies randomly between a voltage in the order of 1.8 V, and a voltage in the order of 3.3 V.

Figure 2:
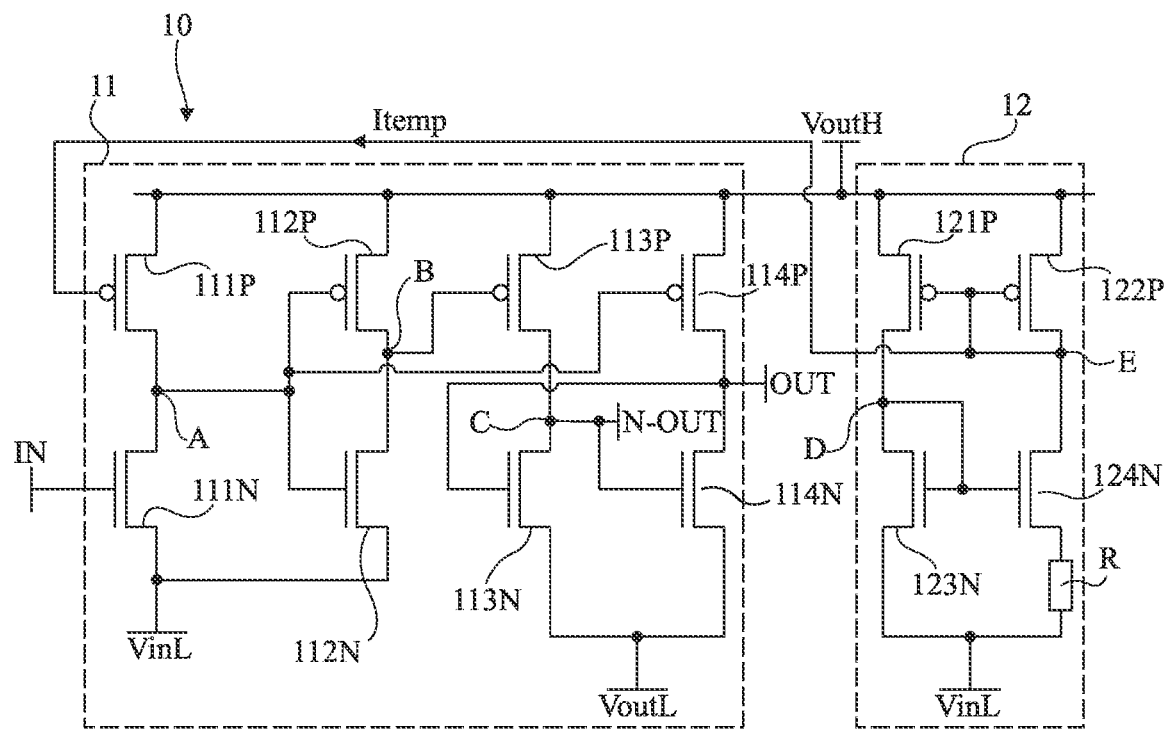
FIG. 2 shows an example of implementation of the embodiment of FIG. 1.

FIG. 2 illustrates an electric diagram of an embodiment of the level converter circuit 10 described in relation with FIG. 1.

The conversion circuit 11 (delimited in dotted lines) of circuit 10 comprises a first inverter stage formed of MOS transistors 111N and 111P. Transistor 111N is of type N, and transistor 111P is of type P. Transistors 111N and 111P are coupled, preferably connected, in series by their conduction terminals. The source of transistor 111N is coupled, preferably connected, to a node receiving voltage level VinL. The drain of transistor 111N is coupled, preferably connected, to a node A. The gate of transistor 111N is coupled, preferably connected, to a node receiving input signal IN. The source of transistor 111P is coupled, preferably connected, to a node receiving voltage level VoutH. The drain of transistor 111P is coupled, preferably connected, to node A. The gate of transistor 111P is coupled, preferably connected, to a node receiving current Itemp. Further, transistor 111P is mirror-connected with transistors of power supply circuit 12, and is not used as a switch.

Conversion circuit 11 further comprises a second inverter stage formed of MOS transistors 112N and 112P. Transistor 112N is of type N and transistor 112P is of type P. transistors 112N and 112P are coupled, preferably connected, in series by their conduction terminals. The source of transistor 112N is coupled, preferably connected, to the node receiving voltage level VinL. The drain of transistor 112N is coupled, preferably connected, to a node B. The gate of transistor 112N is coupled, preferably connected, to node A. The source of transistor 112P is coupled, preferably connected, to the node receiving voltage level VoutH. The drain of transistor 112P is coupled, preferably connected, to node B. The gate of transistor 112P is coupled, preferably connected, to node A.

Conversion circuit 11 further comprises a third inverter stage formed of MOS transistors 113N and 113P. Transistor 113N is of type N and transistor 113P is of type P. Transistors 113N and 113P are coupled, preferably connected, in series by their conduction terminals. The source of transistor 113N is coupled, preferably connected, to a node receiving voltage level VoutL. The drain of transistor 113N is coupled, preferably connected, to a node C supplying output signal N-OUT. The gate of transistor 113N is coupled, preferably connected, to a node supplying output signal OUT. The source of transistor 113P is coupled, preferably connected, to the node receiving voltage level VoutH. The drain of transistor 113P is coupled, preferably connected, to node C. The gate of transistor 113 is coupled, preferably connected, to node B.

Conversion circuit 11 further comprises a fourth inverter stage formed of MOS transistors 114N and 114P. Transistor 114N is of type N, and transistor 114P is of type P. Transistors 114N and 114P are coupled, preferably connected, in series by their conduction terminals. The source of transistor 114N is coupled, preferably connected, to the node receiving voltage level VoutL. The drain of transistor 114N is coupled, preferably connected, to the node supplying output signal OUT. The gate of transistor 114N is coupled, preferably connected, to node C. The source of transistor 114P is coupled, preferably connected, to the node receiving voltage level VoutH. The drain of transistor 114P is coupled, preferably connected, to the node supplying output signal OUT. The gate of transistor 114P is coupled, preferably connected, to node A.

N-type MOS transistors 111N, 112N, 113N, and 114N are all sized to be conductive when the voltage at their gate is greater than threshold voltage VIH. P-type MOS transistors 111P, 112P, 113P, and 114P are all sized to be conductive when the voltage at their gate is greater than threshold voltage VIL.

The power supply circuit 12 (delimited in dotted lines) of circuit 10 comprises a first current mirror formed of two P-type MOS transistors 121P and 122P. The source of transistor 121P is coupled, preferably connected, to the node receiving voltage level VoutH. The drain of transistor 121P is coupled, preferably connected, to a node D. The gate of transistor 121P is coupled, preferably connected, to a node E. The source of transistor 122P is coupled, preferably connected, to the node receiving voltage level VoutH. The drain of transistor 122P is coupled, preferably connected, to node E. The gate of transistor 122P is coupled, preferably connected, to node E.

Power supply circuit 12 further comprises a second current mirror formed of two N-type MOS transistors 123N and 124N. The source of transistor 123N is coupled, preferably connected, to the node receiving voltage level VinL. The drain of transistor 123N is coupled, preferably connected, to node D. The gate of transistor 123N is coupled, preferably connected, to node D. The source of transistor 124N is coupled, preferably connected, to a first terminal of a resistor R. The second terminal of resistor R is coupled, preferably connected, to the node receiving voltage level VinL. The drain of transistor 124N is coupled, preferably connected, to node E. The gate of transistor 124N is coupled, preferably connected, to node D.

The transistors 121P, 122P, 123N, and 124N, of circuit 12, all operate in a low inversion mode. The current Itemp supplied by circuit 10 is then proportional to the ratio of the difference between the potentials present on the gate and the source of transistors 121P and 122P to the resistance of resistor R. The resistance of resistor R being inversely proportional to temperature, current Itemp is proportional to temperature.

Figure 3:
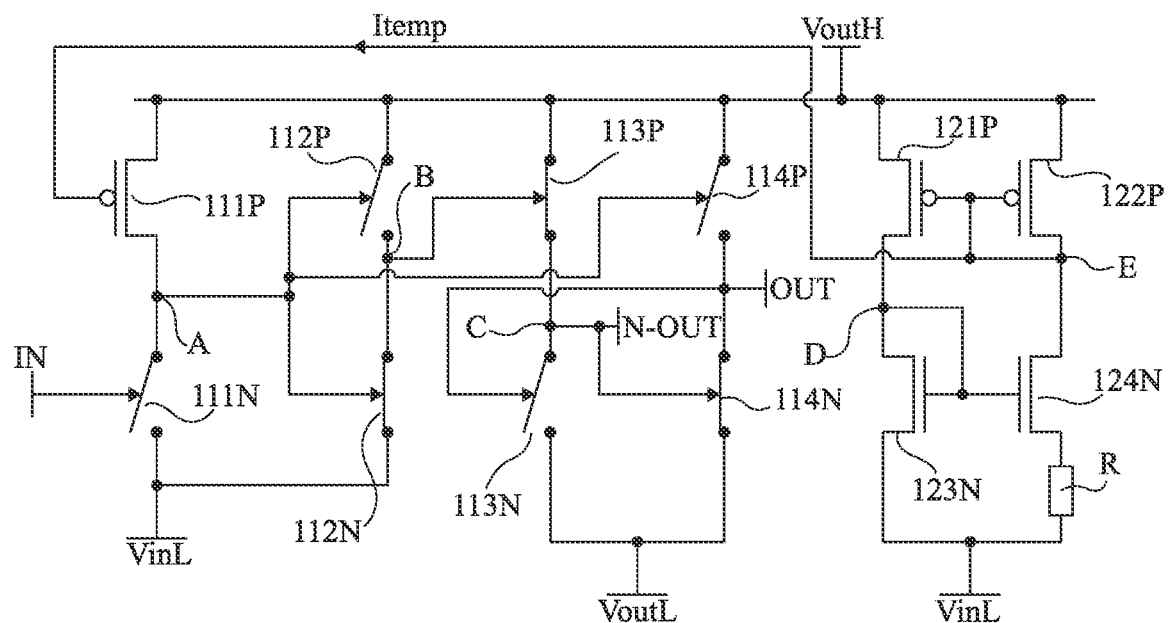
FIG. 3 shows an equivalent diagram of the circuit of FIG. 2.
Figure 4:
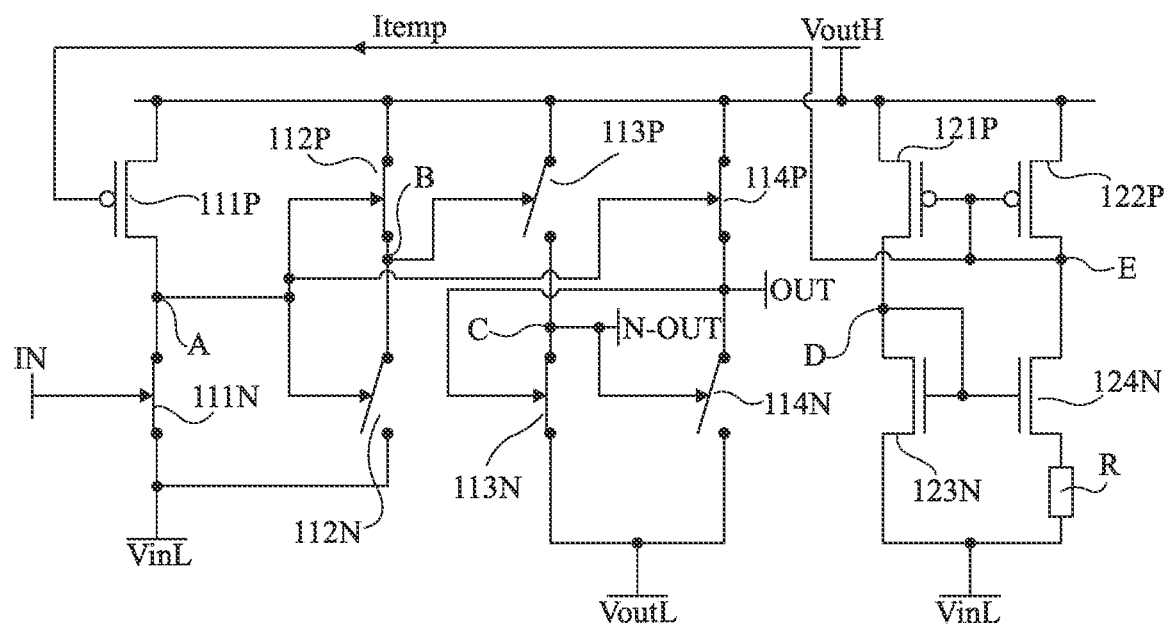
FIG. 4 shows another equivalent diagram of the circuit of FIG. 2.

The general operation of the embodiment of circuit 10, detailed in relation with FIG. 2, is described in relation with FIGS. 3 and 4.

FIG. 3 is a first equivalent electric diagram of the level converter circuit 10 described in relation with FIG. 2, in the case where input signal IN represents a logic "0".

In FIG. 2, a so-called "conductive" transistor is represented by the electronic symbol of an on switch, and a so-called "non-conductive" transistor is represented by the electronic symbol of an off switch.

When input signal IN represents a logic "0", its voltage is in the order of VinL, and is smaller than threshold VIL. Thus, the transistor 111N of conversion circuit 11 is non-conductive. The current control of transistor 111P is performed by current Itemp and the potential of node A is set to VoutH by transistor 111P.

Transistors 112N and 112P are controlled by the potential of node A. Transistor 112N is then conductive and transistor 112P is then non-conductive. Node B is coupled to the node receiving voltage level VinL.

Transistor 113P is controlled by the potential of node B and is then conductive. Node C is coupled to the node receiving voltage level VoutH. Output signal N-OUT then represents a logic "1" since its voltage is equal to voltage level VoutH.

Transistor 114P is controlled by the potential of node A and is then non-conductive. Transistor 114N is controlled by the potential of node C and is then conductive. The node supplying output signal OUT represents a logic "0" since its voltage is equal to voltage level VoutL.

Transistor 113N is controlled by output signal OUT and is then non-conductive. Node C is thus only coupled to the node receiving voltage level VoutH.

FIG. 4 is a first equivalent electric diagram of the level converter circuit 10 described in relation with FIG. 2, in the case where input signal IN represents a logic "1".

In FIG. 4, a so-called "conductive" transistor is represented by the electronic symbol of an on switch and a so-called "non-conductive" transistor is represented by the electronic symbol of an off switch.

When input signal IN represents a logic "1", its voltage is in the order of VinH, and is greater than threshold VIH. Thus, the transistor 111N of conversion circuit 11 is conductive. The current control of transistor 111P is performed by current Itemp and the potential of node A is set to VinL by transistor 111N.

Transistors 112N and 112P are controlled by the potential of node A. Transistor 112N is then non-conductive and transistor 112P is then conductive. Node B is coupled to the node receiving voltage level VoutH.

Transistor 113P is controlled by the potential of node B and is then non-conductive.

Transistor 114P is controlled by the potential of node A and is then conductive. The node supplying output signal OUT is coupled to the node receiving voltage VoutH. Output signal OUT represents a logic "1" since its voltage is equal to voltage level VoutH.

Transistor 113N is controlled by output signal OUT and is then conductive. Node C is thus coupled to the node receiving voltage level VoutL. Output signal N-OUT then represents a logic "0" since its voltage is equal to voltage level VoutH.

Transistor 114N is controlled by the potential of node C and is thus non-conductive.

Various embodiments and variants have been described. Those skilled in the art will understand that certain features of these various embodiments and variants may be combined, and other variants will occur to those skilled in the art. In particular, other embodiments of conversion circuits and of current power supply circuits supplying a current proportional to temperature may be envisaged.

Finally, the practical implementation of the described embodiments and variations is within the abilities of those skilled in the art based on the functional indications given hereabove.

What is claimed is:

1. A device comprising:
   a level converter circuit comprising:
      a first transistor, a gate of the first transistor being configured to receive a current proportional to a temperature; and
      a power supply circuit configured to supply the current proportional to the temperature, the power supply circuit being coupled with the gate of the first transistor, the power supply circuit comprising a first current mirror circuit and a second current mirror circuit.

2. The device of claim 1, wherein the first current mirror circuit comprises two P-type MOS transistors.

3. The device of claim 1, wherein the second current mirror circuit comprises two N-type MOS transistors.

4. The device of claim 1, wherein the level converter circuit is configured to provide a first analog output signal.

5. The device of claim 4, wherein the level converter circuit is further configured to provide a second analog output signal, the second analog output signal being an inverse of the first analog output signal.

6. The device of claim 1, wherein the level converter circuit further comprises a first inverter stage, the first inverter stage comprising the first transistor and a second transistor coupled in series with the first transistor.

7. The device of claim 6, the level converter circuit further comprises a second inverter stage coupled in parallel with the first inverter stage.

8. The device of claim 7, the level converter circuit further comprises a third inverter stage coupled in parallel with the first inverter stage and the second inverter stage.

9. An electronic device comprising:
a current supply circuit configured to supply a current proportional to a temperature; and
a conversion circuit coupled to the current supply circuit, the conversion circuit comprising a first inverter stage, the first inverter stage comprising a first transistor of a first type and a second transistor of a second type, wherein a gate of the first transistor is configured to receive an input signal and wherein a gate of the second transistor is configured to receive the current proportional to the temperature.

10. The electronic device of claim 9, wherein the first transistor is an NMOS transistor.

11. The electronic device of claim 9, wherein the second transistor is a PMOS transistor.

12. The electronic device of claim 9, wherein the second transistor is mirror-connected with transistors of the current supply circuit.

13. The electronic device of claim 9, wherein respective drains of the first transistor and the second transistor are coupled to each other.

14. The electronic device of claim 9, wherein a source of the first transistor is coupled to a first node receiving a first voltage level and a source of the second transistor is coupled to a second node receiving a second voltage level, the second voltage level being higher than the first voltage level.

15. The electronic device of claim 9, wherein the conversion circuit further comprises a second inverter stage, the second inverter stage comprising a third transistor and a fourth transistor.

16. The electronic device of claim 15, wherein respective drains of the third transistor and the fourth transistor are coupled to each other.

17. The electronic device of claim 16, wherein a gate of the third transistor is coupled to respective drains of the first transistor and the second transistor.

18. A circuit comprising:
an analog input configured to receive an input signal varying between:
a low state, the low state having a respective voltage level smaller than a first voltage level; and
a high state, the high state having a respective voltage level greater than a second voltage level, wherein the second voltage level is greater than the first voltage level;
a conversion circuit comprising a first inverter stage, the first inverter stage comprising a first transistor of a first type and a second transistor of a second type different from the first type, the conversion circuit being configured to:
receive the input signal at a gate of the first transistor;
receive a supply current proportional to temperature at a gate of the second transistor; and
convert the input signal to a first output signal and a second output signal;
a first digital output configured to output the first output signal; and
a second digital output configured to output the second output signal.

19. The circuit of claim 18, wherein the second output signal is an inverse of the first output signal.

20. The circuit of claim 18, wherein the input signal varies between a voltage in the order of 1.8 V and a voltage in the order of 3.3 V.

* * * * *